United States Patent [19]

Yoshida

[11] Patent Number: 5,206,216
[45] Date of Patent: Apr. 27, 1993

[54] METHOD FOR FABRICATING OXIDE SUPERCONDUCTING WIRES BY LASER ABLATION

[75] Inventor: Noriyuki Yoshida, Osaka, Japan

[73] Assignee: Sumitomo Electric Industries, Ltd., Osaka, Japan

[21] Appl. No.: 759,846

[22] Filed: Sep. 16, 1991

Related U.S. Application Data

[63] Continuation of Ser. No. 525,530, May 18, 1990, abandoned.

[30] Foreign Application Priority Data

May 19, 1989 [JP] Japan .................................. 1-126848

[51] Int. Cl.$^5$ .............. B05D 3/06; B05D 5/12
[52] U.S. Cl. ..................................... 505/1; 505/732;
505/730; 505/742; 427/62; 427/596; 427/314;
427/117; 427/63
[58] Field of Search ................ 505/1, 732, 731, 730,
505/742; 427/62, 63, 53.1, 54.1, 117, 314, 596;
29/599; 204/192.24

[56] References Cited

U.S. PATENT DOCUMENTS 4,987,007  1/1991  Wagal et al. .................. 427/53.1

FOREIGN PATENT DOCUMENTS 0341520  11/1989  European Pat. Off. .
61-69960  8/1986  Japan .
63-271816  11/1988  Japan .
1-149315  6/1989  Japan .................................. 505/740

OTHER PUBLICATIONS

Kanai et al, "Formation of Bi–Sr–Ca–Cu–O Thin Films by a Laser Sputtering Method," Jpn. J. Appl. Phys. 27(7) Jul. 1988, L293–296.

Roas et al., "Epitaxial Growth of YBa$_2$Cu$_3$O$_{7-x}$ Thin Films by a Laser Evaporation Process", Appl. Phys. Lett. 53(16) Oct. 1988 pp. 1557–1559.

A. Al-Sharif et al., "Attempts to prepare Bi-based superconductors on a carbon fiber substrate" Proceedings of the Thrity-Fourth Annual Conference on Magnetism and Magnetic Materials, Boston, Mass. 28 Nov.–1 Dec., 1989 & Journal of Applied Physics, vol. 67, No. 9, 1 May 1990, pp. 5023–5025, New York, U.S.

*Primary Examiner*—Shrive Beck
*Assistant Examiner*—Roy V. King
*Attorney, Agent, or Firm*—Pennie & Edmonds

[57] ABSTRACT

Disclosed herein is a method of and an apparatus for fabricating an oxide superconducting wire which comprises a tape-type long base material and an oxide superconducting film formed thereon. The oxide superconducting film is formed by laser ablation of applying a laser beam (2) onto a target (4) while translating a long base material (6) along its longitudinal direction and depositing atoms and/or molecules scattered from the target (4) on the base material (6).

7 Claims, 2 Drawing Sheets

METHOD FOR FABRICATING OXIDE SUPERCONDUCTING WIRES BY LASER ABLATION

This is a continuation of application Ser. No. 07/525,530, filed May 18, 1990 now abandoned.

BACKGROUND OF THE INVENTION

1. Field of the Invention

The present invention relates to a method of and an apparatus for fabricating an oxide superconducting wire, and more particularly, it relates to a method of and an apparatus for fabricating a wire which comprises an oxide superconducting film formed on the surface of a long base material.

2. Description of the Background Art

As a method of fabricating an oxide superconducting wire, there has been developed a method of charging powder of an oxide superconductive material into a silver pipe and wire-drawing the same, a method of depositing a thick film of an oxide superconductive material on a flexible base material by plasma flame coating, or the like (hereinafter referred to as first prior art).

On the other hand, a laser deposition process has been proposed a method of forming a thin film of an oxide superconductive material, although the same is not yet applied to fabrication of an oxide superconducting wire. In relation to such laser deposition, an excimer laser, a nitrogen laser, the second harmonics of a YAG laser, a $CO_2$ gas laser or the like is employed to deposit an oxide superconducting film of Y-Ba-Cu-O, Bi-Sr-Ca-Cu-O or Tl-Ba-Ca-Cu-O on a base material of strontium titanate, magnesium oxide or the like, thereby obtaining a high-quality film (hereinafter referred to as second prior art). As to the second prior art, refer to Appl. Phys. Lett. 53, 1557 (1988) by B. Roas et al., for example.

In the first prior art, however, there is no control method of desirably orienting current anisotropy of the oxide superconductive material longitudinally along the wire, and critical current density, which is the most important factor of the wire, has been limited to about $10^4$ A/cm$^2$ at the liquid nitrogen temperature.

In the second prior art, on the other hand, the area of a film which is formable on a single-crystalline base material of strontium titanate, magnesium oxide or the like is limited to about $2 \times 2$ [cm$^2$] at the most, although the film is of high quality with critical current density of $10^6$ A/cm$^2$ at the liquid nitrogen temperature. Thus, it has been substantially impossible to form the film on a long base material, in order to fabricate a superconducting wire.

SUMMARY OF THE INVENTION

Accordingly, an object of the present invention is to enable fabrication of a high-quality oxide superconducting wire using laser deposition.

In order to solve the aforementioned technical problem, the present invention provides the following method of and apparatus for fabricating an oxide superconducting wire:

The inventive method of fabricating an oxide superconducting wire uses laser deposition of applying a laser beam onto a target containing components of an oxide superconductive material and depositing atoms and/or molecules scattered from the target on a base material, which is formed by a tape-type long base material, for example, and this long base material is translated along its longitudinal direction, thereby to form a film of the oxide superconductive material on the surface of the long base material.

In the aforementioned fabricating method, a mask may be provided between the target and the tape-type base material, in order to limit a film forming region.

A plurality of film forming stations, which are provided with targets respectively, may be arranged in series longitudinally along a long base material, to repeat a step of forming a film of an oxide superconductive material by a plurality of times with respect to the long base material, which is translated.

The laser beam is preferably prepared from a laser beam emitted from an excimer laser, that emitted from a nitrogen laser, or the 4th or the 2nd harmonics laser beam emitted from a YAG laser.

A zirconia ceramic tape or a metal tape of nickel or nickel group alloy is advantageously employed as the long base material, in order to provide the base material with flexibility.

Further, a Y-Ba-Cu-O, Bi-Sr-Ca-Cu-O or Tl-Ba-Ca-Cu-O superconductive material is advantageously employed as the oxide superconductive material forming the target.

The present invention also provides an apparatus for fabricating an oxide superconducting wire, for carrying out the aforementioned method. This fabricating apparatus comprises:

base material holding means having a supply unit and a take-up unit for a long base material and translating the long base material along its longitudinal direction between the supply unit and the take-up unit;

a laser for emitting a laser beam; and a target of an oxide superconductive material irradiated with the laser beam for scattering atoms and/or molecules to be deposited on the translated long base material by the irradiation of the laser beam.

According to the method of forming a film of an oxide superconductive material by laser deposition, it has been possible to form a high-quality film only on a region of about 2 cm square of a single-crystalline base material of strontium titanate, magnesium oxide or the like, for example. According to the present invention, it is possible to deposit such a high-quality film longitudinally along a long base material by translating the base material along its longitudinal direction.

Thus, according to the present invention, it is possible to obtain an oxide superconducting wire formed of a long base material which is provided on its surface with a high-quality film of an oxide superconductive material, by translating the long base material along its longitudinal direction while advantageously using the laser deposition technique which is capable of forming a high-quality film of an oxide superconductive material.

Therefore, an oxide superconducting wire obtained according to the present invention can be effectively applied to a superconducting power cable, a wire for a magnet or the like, for example.

Further, the laser deposition is higher in speed of film formation as compared with sputtering and vacuum deposition. According to an embodiment of the present invention as hereinafter described, therefore, a wire can be fabricated at a high speed of about 5 cm/min. to 50 cm/min., for example. Thus, the present invention is particularly effectively applied to fabrication of a wire for a power cable whose length is tens of to several hundred km.

In the inventive method of fabricating an oxide superconducting wire, it is preferable to employ a target having a flat surface. This is because the surface state of the target affects the properties of the as-formed film of the oxide superconductive material. If the target has a rough surface, energy density provided by the laser beam is finely changed to undesirably affect the properties of the film. Therefore, the target preferably has a flat surface, in order to form the film while maintaining stable properties.

In order to form the film of the oxide superconductive material, a mask is preferably employed to limit a film forming region, thereby to attain the following advantage: As hereinabove described, it is possible to form a high-quality film only on a region of about 2 cm square by laser deposition. Therefore, if the mask is so employed that only a high-quality film formed on such a limited region is deposited on a base material, it is possible to form only a high-quality film on the base material within films obtained by laser deposition.

If a translated long base material is passed through a plurality of film forming stations, it is possible to increase the speed of film formation in proportion to the number of the stations. In other words, it is possible to reduce the time required for attaining the same film thickness. Therefore, it is possible to efficiently fabricate a long oxide superconducting wire.

When a laser beam having high energy density is employed, the temperature can be reduced in the laser deposition step by photochemical reaction. Examples of such a laser beam are laser beams emitted from excimer lasers such as ArF, KrF and XeCl lasers having oscillation wavelengths of 193 nm, 248 nm and 308 nm respectively, a laser beam emitted from a nitrogen laser having an oscillation wavelength of 337 nm, and the 4th and the 2nd harmonics laser beams of a YAG laser having oscillation wavelengths of 532 nm and 266 nm respectively.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
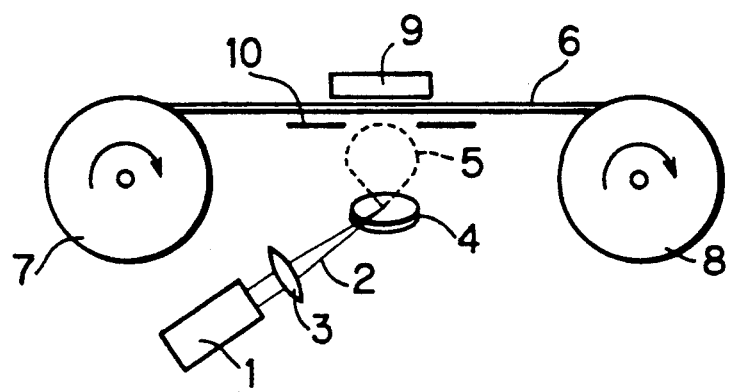
FIG. 1 is an explanatory diagram showing an apparatus for fabricating an oxide superconducting wire according to an embodiment of the present invention.

FIG. 1 is an explanatory diagram schematically showing an apparatus for fabricating an oxide superconducting wire according to an embodiment of the present invention.

Referring to FIG. 1, a laser beam 2 emitted from a laser unit 1 is converged by a lens 3, and applied onto a target 4 having a flat surface. The laser unit 1 sustains pulse repetition if the same is of a pulsed operation type, or maintains a constant optical output if the same is of a continuous operation type. A plasma 5 is generated in the vicinity of a portion of the target 4 irradiated with the laser beam 2.

On the other hand, a tape-type base material 6 is transferred from a supply reel 7, serving as a supply unit for the base material 6, to a take-up reel 8 serving as a take-up unit. The tape-type base material 6 is translated along its longitudinal direction between the supply reel 7 and the take-up reel 8. The path for such longitudinal translation of the tape-type base material 6 is located above the target 4. A base material heat source 9 is positioned on the normal of the target 4, to heat the tape-type base material 6 with its radiant heat.

The target 4 is formed of an oxide superconductive material, so that a film of the oxide superconductive material is formed by laser deposition on the surface of the tape-type base material 6. In order to limit a region for forming the film of the oxide superconductive material to a portion of the tape-type base material 6 heated by the base material heat source 9, a mask 10 is provided between the tape-type base material 6 and the target 4.

A vacuum chamber (not shown) having an exhauster is provided to enclose at least the target 4 and the heated portion of the tape-type base material 6.

Figure 2:
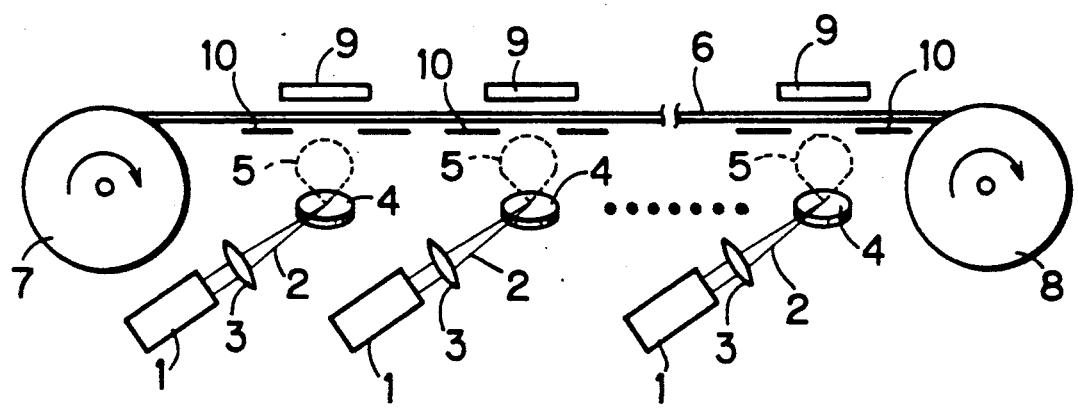
FIG. 2 is an explanatory diagram showing an apparatus for fabricating an oxide superconducting wire according to another embodiment of the present invention.

FIG. 2 is an explanatory diagram showing an apparatus for fabricating an oxide superconducting wire according to another embodiment of the present invention.

The apparatus shown in FIG. 2 is characterized in that a plurality of assemblies, each comprising the laser unit 1, the lens 3, the target 4, the base material heat source 9 and the mask 10 shown in FIG. 1, are serially arranged along the longitudinal direction of a translated tape-type base material 6. Other structure of this embodiment is similar to that shown in FIG. 1, and hence corresponding parts are denoted by the same reference numerals to omit redundant description.

According to the apparatus shown in FIG. 2, the tape-type base material 6 is subjected to a plurality of deposition steps during the translation along its longitudinal direction. Thus, the total deposition time for the tape-type base material 6 is increased in proportion to the number of the aforementioned deposition steps, whereby the time required for each deposition step for attaining the same film thickness is reduced in inverse proportion to the number of the deposition steps. Thus, the speed for fabricating the wire is increased in proportion to the number of the deposition steps.

Some of the plurality of deposition steps in the apparatus shown in FIG. 2 may be used for forming at least one of a stabilizing layer, an insulating layer and an intermediate layer (buffer layer), which are known as elements for a superconducting wire.

Examples carried out according to the present invention are now described in detail.

EXAMPLE 1

The laser deposition film forming apparatus shown in FIG. 1 was employed to fabricate an oxide superconducting wire. The laser unit 1 was prepared by an excimer laser unit, to apply by ArF oscillation a laser beam of 193 nm in wavelength onto the target 4. This laser beam was of a pulsed operation type, and the pulse repetition rate was 50 p.p.s. (pulses per second). The apparatus shown in FIG. 1 is contained in one vacuum chamber, except for the laser unit 1 and the lens 3. Oxygen gas of 1 Torr was incorporated into the vacuum chamber as reaction gas. The tape-type base material 6 was prepared by a zirconia ceramic tape, and its surface was heated to a temperature of 600° C. The base material heat source 9 was prepared by a halogen lamp heater, to heat the base material 6 with its radiant heat. The target 4 was prepared from an oxide superconductive material of $Y_1Ba_2Cu_3O_x$. This target 4 was spaced by 30 mm apart from the base material 6, and a perforated mask 10 of 30 mm×30 mm was provided in a position separated by 1 mm from the surface of the base material 6.

Thus, the tape-type base material 6 was translated along its longitudinal direction at a rate of 5 cm/min., to form a film of the oxide superconductive material. The as-formed wire exhibited critical current density of $4 \times 10^6$ A/cm$^2$ at the liquid nitrogen temperature, with dispersion of $\pm 5\%$ in regions over a 10 m long portion of the wire. The film of the oxide superconductive material formed on the wire was 1 μm in thickness.

EXAMPLE 2

A superconducting wire was fabricated under the same film forming conditions as Example 1, except for that the tape-type base material 6 was prepared by a nickel tape.

The critical current density of the as-formed wire rod was $8 \times 10^5$ A/cm$^2$ at the liquid nitrogen temperature, with dispersion of $\pm 13\%$ in regions over a 10 m long portion of the wire.

EXAMPLE 3

The laser deposition film forming apparatus shown in FIG. 2 was employed to sequentially form a film of an oxide superconductive material on a tape-type base material 6 formed of a zirconia ceramic tape through 10 serial deposition steps, each of which was identical to Examples 1 and 2.

It was possible to increase the speed for carrying the tape-type base material 6 up to 50 cm/min., in order to obtain a film of the oxide superconductive material having a thickness of 1 μm, similarly to Example 1.

The critical current density of the as-formed superconducting wire was $3.2 \times 10^6$ A/cm$^2$ at the liquid nitrogen temperature, with dispersion of $\pm 7\%$ in regions over a 10 m long portion of the wire. Thus, it has been recognized that a high-quality superconducting wire can be obtained substantially similarly to Example 1.

Slow cooling under relatively high partial pressures of oxygen is effective for incorporating oxygen into a superconductor, as known in a Y-Ba-Cu-O oxide superconductor. An oxygen incorporating chamber may be provided subsequently to a film forming station to cool a superconducting film slowly under a relatively high pressure of oxygen, so that a superconducting wire having uniform characteristics can be obtained.

Figure 3:
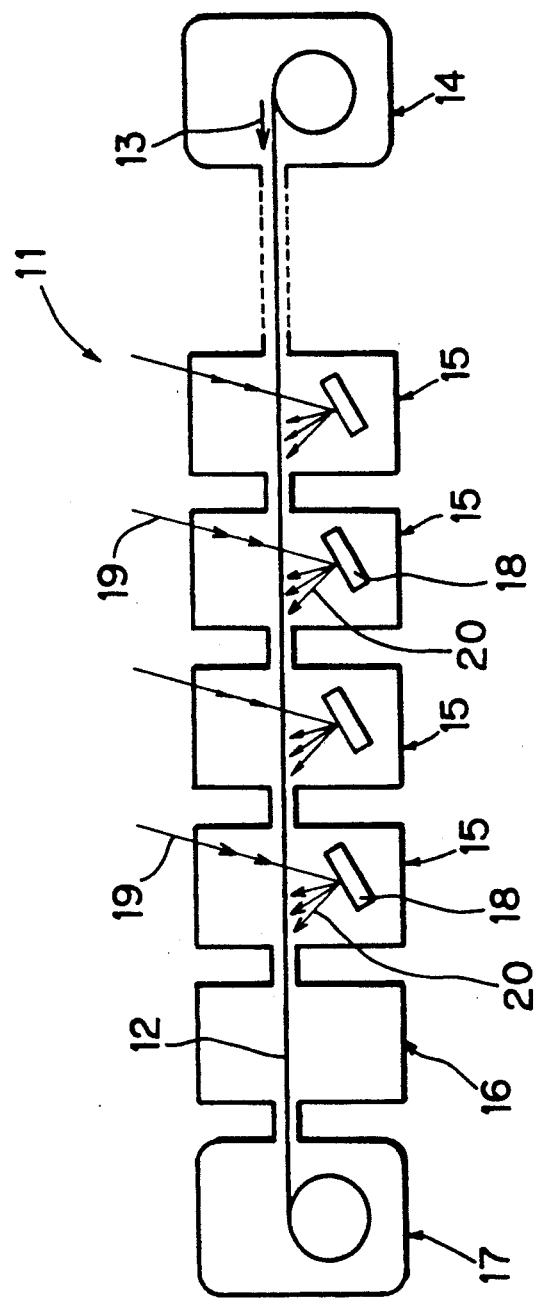
FIG. 3 is an explanatory diagram showing an apparatus for fabricating an oxide superconducting wire according to still another embodiment of the present invention.

FIG. 3 shows an apparatus 11 for fabricating an oxide superconducting wire to which an oxygen incorporating chamber.

A long flexible base material 12 is drawn out from a base material supply part 14 along an arrow 13, passed through a plurality of film forming chambers 15 and a subsequent oxygen incorporating chamber 16, and taken up in a base material take-up part 17. Some of the film forming chambers 15 are not shown in FIG. 3. This embodiment is provided with 10 film forming chambers 15.

Targets 18 are provided in the film forming chambers 15 respectively. Laser beams 19 are applied to the targets 18 respectively, so that particles scattered from the targets 18 as shown by arrows 20 are deposited on the base material 12, to form an oxide superconducting thin film.

According to this embodiment, a closed or substantially closed space is defined along the base material supply part 14, the film forming chambers 15, the oxygen incorporating chamber 16 and the base material take-up part 17. In general, however, a pressure applied to each film forming chamber 15 is lower than that applied to the oxygen incorporating chamber 16. In order to allow such pressure difference between the film forming chamber 15 and the oxygen incorporating chamber 16, it is preferable to provide a differential exhauster (not shown) between the film forming chamber 15 and the oxygen incorporating chamber 16, as well known in the art.

The base material 12 is generally heated to a temperature of 500° to 600° C., for example, in the film forming chamber 15 and the oxygen incorporating chamber 16. Such heating may be achieved by providing a heater in the film forming chamber 15 against the base material 12 and entirely heating the internal atmosphere of the oxygen incorporating chamber 16, while the base material 12 itself may be energized/heated if the same is prepared from a conductive metal.

EXAMPLE 4

An oxide superconducting wire rod was fabricated by the aforementioned apparatus 11 having 10 film forming chambers 15 and one oxygen incorporating chambers 16.

In each film forming chamber 15, a KrF excimer laser beam 19 was applied onto the target 18 of $Y_1Ba_2Cu_3O_x$, to form an oxide superconducting thin film on a tape-type base material 12 of single-crystalline (100) MgO. Film forming conditions were a substrate temperature of 650° C., an oxygen pressure of 300 mTorr in each film forming chamber 15, a distance of 70 mm between the base material 12 and each target 18, and energy density of 2.5 J/cm$^2$ and a repetition frequency of 5 Hz of the laser beam 19. The oxygen incorporating chamber 16 was under an oxygen pressure of 400 mTorr. The oxygen incorporating chamber 16 was at a temperature of 500° C., so that the temperature of the base material 12 was not reduced below 500° C. during movement from the film forming chamber 15 to the subsequent oxygen incorporating chamber 16.

When the base material 12 was fed at a rate of 20 mm/min., the oxide superconducting thin film provided on the oxide superconducting wire taken up in the base material take-up part 17 attained a thickness of 500 Å, and this oxide superconducting wire exhibited a critical temperature of 88° K. and critical current density of $2 \times 10^6$ A/cm$^2$ in liquid nitrogen. Further, the critical current density had dispersion within $\pm 2\%$ over 10 m long portion of the wire. Thus, the wire having an extremely uniform characteristic was able to be produced.

In order to fabricate an oxide superconducting wire by forming an oxide superconducting layer on a tape-type long base material by laser ablation, for example, it is preferable to form on the tape-type base material a buffer layer for preventing diffusion between the base material and the superconducting layer, the superconducting layer, and a stabilizing layer for preventing quenching caused by thermal agitation of the superconducting state, respectively.

In the following embodiment, an oxide superconducting layer is formed by laser ablation, and at least one functional layer to be in contact with the oxide superconducting layer is also formed by laser ablation. Thus, the superconducting layer and at least one functional layer are formed through continuous steps of the tandem system.

The laser ablation process is applicable to formation of various types of functional layers, in addition to the oxide superconducting layer.

In an oxide superconducting wire fabricated by successively forming a buffer layer, an oxide superconducting layer and a stabilizing layer on a tape-type base material, for example, the laser ablation process can be applied to formation of the buffer layer or the stabilizing layer, or both the buffer and stabilizing layers, in addition to formation of the oxide superconducting layer.

In an oxide superconducting wire rod fabricated by successively forming a first buffer layer, an oxide superconducting layer, a second buffer layer and a stabilizing layer on a tape-type base material, the laser ablation process can be applied to formation of the first buffer layer, formation of the second buffer layer, formation of the first and second buffer layers, or formation of the first and second buffer layers and the stabilizing layer.

An embodiment wherein at least one of a plurality of film forming stations is used for forming such a functional layer can be explained with reference to FIG. 2.

A long flexible tape-type base material 6 is drawn out from a reel 7 provided in a supply chamber, passed through a first film forming chamber and a subsequent second film forming chamber, and wound on a reel 8 provided in a take-up chamber.

A target 4 of MgO, for example, for forming a buffer layer is provided in the first film forming chamber. This target 4 is irradiated with a laser beam 2 which is emitted from a laser 1. Particles thereby scattered from the target 4 are deposited on the tape-type base material 6 to form the buffer layer.

Another target 4 of $Y_1Ba_2Cu_3O_{7-\delta}$, for example, for forming an oxide superconducting layer is provided in the second film forming chamber. This target 4 is irradiated with a laser beam 2 which is emitted from a laser 1. Particles thereby scattered from the target 4 are deposited on the buffer layer, which is provided on the tape-type base material 6, to form the the oxide superconducting layer.

In the apparatus shown in FIG. 2, a closed or substantially closed space is defined along the supply chamber, the first and second film forming chambers and the take-up chamber, so that desired atmospheres can be formed in the first and second film forming chambers respectively.

Although the target is composed of Y-Ba-Cu-O in each Example, it has been confirmed that substantially similar experimental results are obtained with a target which is composed of Bi-Sr-Ca-Cu-O or Tl-Ba-Ca-Cu-O.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of fabricating an oxide superconducting wire using laser ablation of applying a laser beam onto a target containing components of an oxide superconductive material and depositing particles thereby scattered from said target on a heated long base material, said method comprising the steps of:

arranging a mask between said target and said long base material for limiting a film forming region;

feeding said long base material along its longitudinal direction to be passed through a film forming station provided therein with said target;

applying said laser beam onto said target thereby scattering particles from said target by laser ablation under an oxygen pressure of at least 300 mTorr; and depositing said particles on said limited film forming region of said long base material for forming an oxide superconducting film.

2. A method of fabricating an oxide superconducting wire in accordance with claim 1, further comprising the steps of cooling slowly said oxide superconducting film under a partial pressure of oxygen of at least about 100 mTorr higher than that in said film forming station after said step of oxide superconducting film.

3. A method of fabricating an oxide superconducting wire in accordance with claim 1, wherein said film forming station comprises a plurality of film forming stations distributed along a path for feeding said long base material.

4. A method of fabricating an oxide superconducting wire in accordance with claim 1, wherein said laser beam is emitted from a laser selected from the group consisting of an excimer laser, a nitrogen laser, and a YAG laser.

5. A method of fabricating an oxide superconducting wire in accordance with claim 1, wherein one of a zirconia ceramic tape and a metal tape of nickel or nickel group alloy is employed as said base material.

6. A method of fabricating an oxide superconducting wire in accordance with claim 1, wherein said target has one composition selected from the group of Y-Ba-Cu-O, Bi-Sr-Ca-Cu-O and Tl-Ba-Ca-Cu-O.

7. A method for fabricating an oxide superconducting wire in accordance with claim 1, wherein the 4th or 2nd harmonics laser beam emitted from a YAG laser is employed as said laser beam.

* * * * *